US007027305B2

(12) United States Patent
Keating et al.

(10) Patent No.: US 7,027,305 B2
(45) Date of Patent: Apr. 11, 2006

(54) ARRANGEMENT FOR SURFACE MOUNTING OF SUBASSEMBLIES ON A MOTHER BOARD

(75) Inventors: David Keating, Limerick (IL); Antoin Russell, Limercik (IL); Mysore P. Divakar, San Jose, CA (US); Thomas H. Templeton, Fremont, CA (US); John Alan Maxwell, Newbury Park, CA (US)

(73) Assignee: Power-One, Inc., Camarillo, CA (US)

( * ) Notice: Subject to any disclaimer, the term of this patent is extended or adjusted under 35 U.S.C. 154(b) by 37 days.

(21) Appl. No.: 10/715,907

(22) Filed: Nov. 18, 2003

(65) Prior Publication Data

US 2005/0052849 A1 Mar. 10, 2005

Related U.S. Application Data

(60) Provisional application No. 60/500,611, filed on Sep. 5, 2003.

(51) Int. Cl.
*H05K 7/20* (2006.01)

(52) U.S. Cl. ...................... 361/719; 361/803; 361/736; 439/65; 439/79; 439/637

(58) Field of Classification Search ................ 361/719, 361/803, 686, 736, 810; 174/138 G, 138 D; 439/65, 79, 637

See application file for complete search history.

(56) References Cited

U.S. PATENT DOCUMENTS

| | | | | |
|---|---|---|---|---|
| 5,482,474 A * | 1/1996 | Yohn et al. | .................. | 439/79 |
| 5,871,362 A * | 2/1999 | Campbell et al. | ............ | 439/67 |

* cited by examiner

*Primary Examiner*—Kamand Cuneo
*Assistant Examiner*—Hung S. Bui
(74) *Attorney, Agent, or Firm*—Polster, Lieder, Woodruff & Lucchesi, L.C.

(57) ABSTRACT

The invention provides arrangements to facilitate surface mounting of subassembly boards on a motherboard with reliable, high conductivity interconnection. In accordance with the invention, the subassembly interconnection arrangement is composed of separate power and sense connector arms formed on one or more base headers. The arrangement interconnects and supports the subassembly board on the motherboard surface. Each power arm advantageously comprises a plurality of split-based mounting lugs secured to the arm in a coplanar configuration. Each sense connector arm preferably comprises a plurality of connector pins secured to the arm in a coplanar configuration. Embodiments are disclosed for vertical and horizontal surface mounting.

10 Claims, 7 Drawing Sheets

ARRANGEMENT FOR SURFACE MOUNTING OF SUBASSEMBLIES ON A MOTHER BOARD

CROSS REFERENCE TO RELATED APPLICATIONS

This application claims the benefit of U.S. Provisional Application Ser. No. 60/500,611, "Arrangement For Surface Mounting Of Subassemblies On A Motherboard", filed Sep. 5, 2003.

FIELD OF THE INVENTION

This invention relates to arrangements to facilitate surface mounting of subassemblies on a motherboard. It is particularly useful for mounting high power subassemblies, such as surface mount power converters. It provides highly reliable high conductivity interconnection.

BACKGROUND OF THE INVENTION

Electrical systems are becoming faster, denser in the number of components, and increasingly complex. Increasing density typically requires greater current which, in turn, requires low resistance interconnection and effective heat dissipation. Higher speed and larger currents require low inductance. Increasing complexity often requires that subassembly boards be mounted and connected onto system boards ("motherboards").

The presence of multiple processors on motherboards has driven the need to distribute power converters on motherboards at the point of load (POL). The conventional approach to power distribution was to provide power planes in the motherboards and traces of sufficient dimension to handle the power. But multiple processors make power planes increasingly difficult to design and, in some instances, infeasible. With processors driving the need for higher currents (tens of amps) and high slew rates (up to seven hundred amperes per microsecond), motherboard designs are now often based on a distributed power architecture (DPA) providing on-board point of load power converters.

In addition to providing high currents at high slew rates, the interconnection system should provide a reliable conduit for dissipating heat and a reliable, space-efficient design to provide close access to the load. No conventional interconnection system fully meets these diverse requirements and improved systems are needed.

SUMMARY OF THE INVENTION

The invention provides arrangements to facilitate surface mounting of subassembly boards on a motherboard with reliable, high conductivity interconnection. In accordance with the invention, the subassembly interconnection arrangement is composed of separate power and sense connector arms formed on one or more base headers. The arrangement interconnects and supports the subassembly board on the motherboard surface. Each power arm advantageously comprises a plurality of split-based mounting lugs secured to the arm in a coplanar configuration. Each sense connector arm preferably comprises a plurality of connector pins secured to the arm in a coplanar configuration. Embodiments are disclosed for vertical and horizontal surface mounting.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
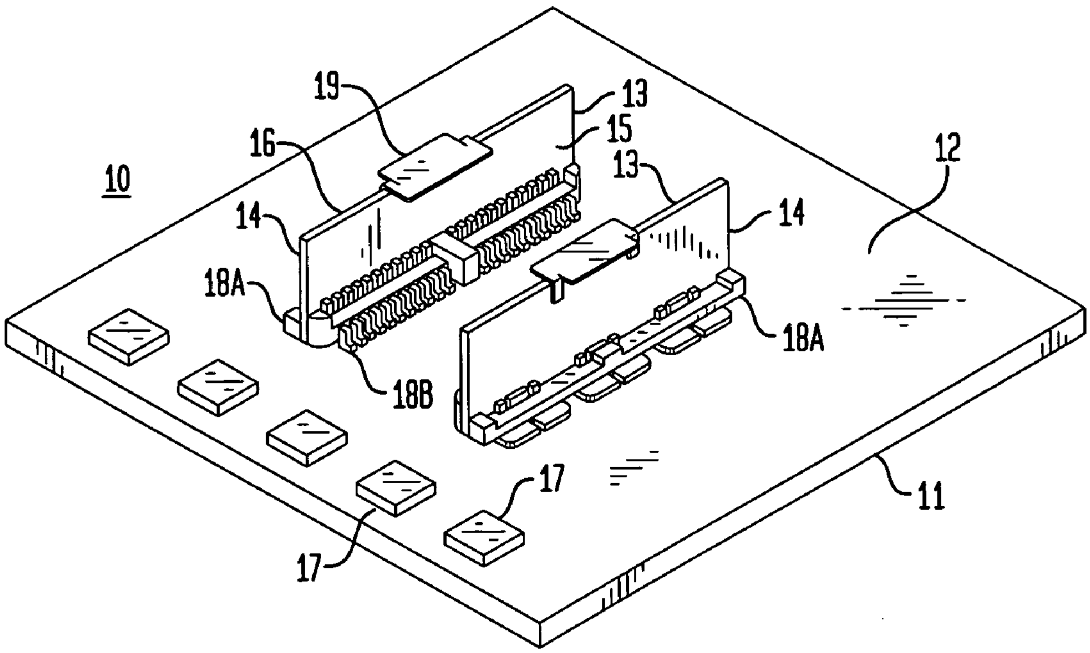
FIG. 1 is a perspective view showing a system circuit board having subassembly circuit boards vertically connected to it.

Referring to the drawings, FIG. 1 is a perspective view of a connected circuit assembly 10 comprising a first circuit device 11 having a generally planar major surface 12 and one or more (here two) vertically mounted subassemblies 13 having a subassembly board 14 with major surfaces 15 and edges 16. The first circuit device 11 can, for example, be a system board (mother board). Each board device 11, 14 will typically comprise a printed circuit board having substantially planar major surfaces that bear mounting pads and adherent conductive leads (not shown) and a plurality of electrical components 17 such as integrated circuits, resistors, capacitors or inductors. The circuit boards are typically comprised of insulating PC boards that may include one or more internal conductive layers.

If the subassembly board 14 were connected to the first circuit device 11 with the major surfaces parallel, the subassembly board 14 would occupy a relatively large area on the surface of device 11. Moreover, if the devices were printed circuit boards and were to be connected using conventional surface mount technology, co-planarity would be an issue, as mounting pads must be in contact for reliable connection by solder reflow.

Rather than connecting the devices with their major surfaces parallel, the present inventors contemplate that the subassembly board 14 will be connected with its major surface(s) perpendicular to the major surface of device 11, and they provide subassembly components to facilitate such perpendicular (vertical) connection compatible with surface mount fabrication of the assembly 10. Specifically, they provide the subassembly board 14 with a pair of base headers 18A, 18B to permit vertical mounting and, conveniently, a pickup cap 19, to permit pick and place positioning of the subassembly.

Figure 2:
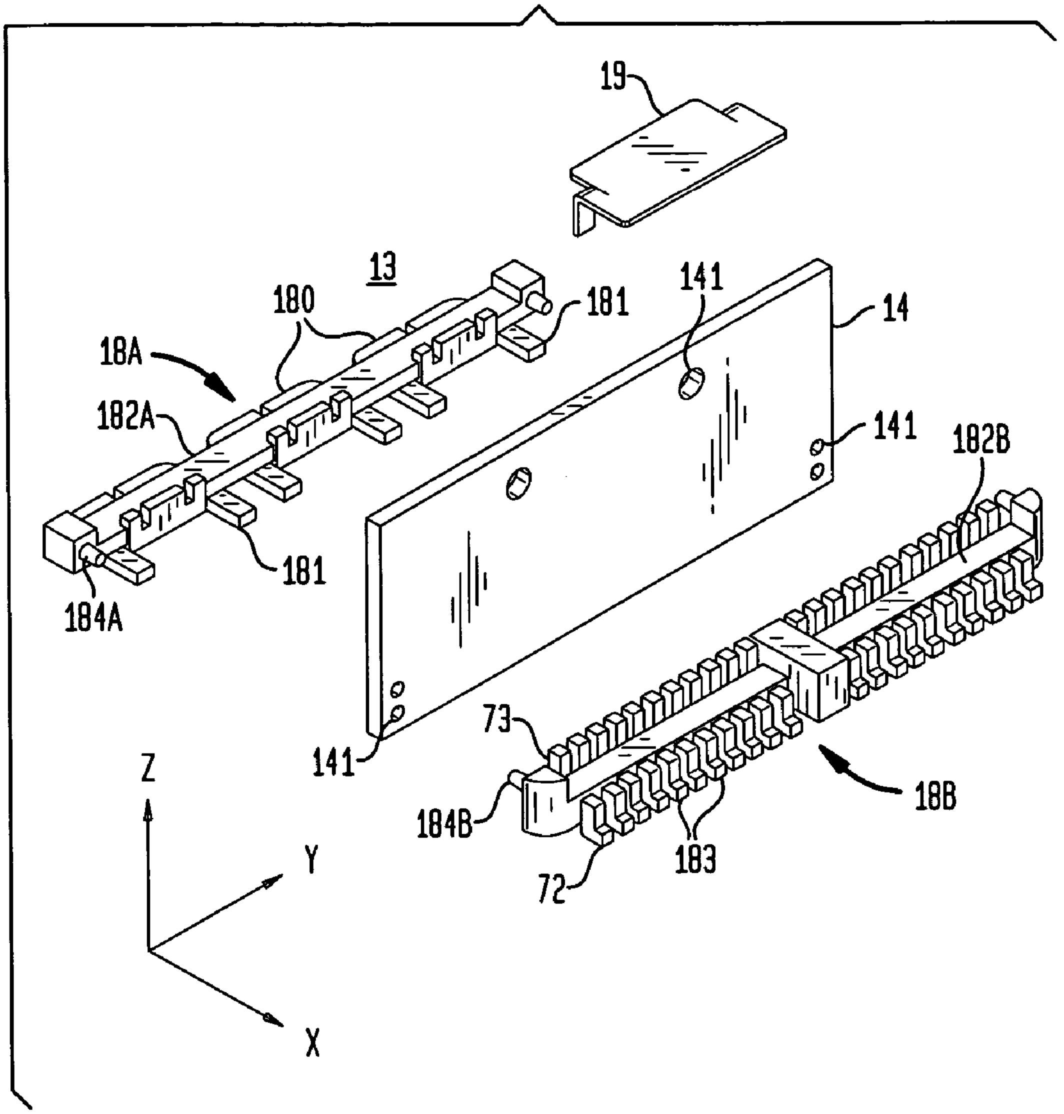
FIG. 2 is an exploded view showing the components of an exemplary subassembly.

FIG. 2 is an exploded view showing the components of an advantageous embodiment of a subassembly 13 comprising subassembly board 14, a support base header 18A, a multiple pin base header 18B and a pickup cap 19.

With reference to the coordinate system shown in FIG. 2, board 14 has its major surfaces in the yz plane, and it is contemplated that it will be vertically mounted on a motherboard having a major surface in the xy plane. The base headers 18A, 18B are coupled to the board 14 along the edge adjacent the motherboard. The headers typically have a length along board 14 greater than their transverse dimension perpendicular to the board, e.g. the header y dimension is typically greater than the x dimension and typically co-extensive with the subassembly board edge.

The base header 18A advantageously comprises a plurality of metal support lugs 180 (better shown in FIG. 4A) each having a pair of protruding support arms 181. The lugs are attached to a longitudinal element 182A in co-planar relationship, e.g. the bottom surfaces of each lug 180 will be co-planar with the motherboard surface on the xy plane. The attachment is advantageously achieved by molding the lugs 180 into a polymer element 182A. The arms 181 conveniently support board 14.

Figure 7:
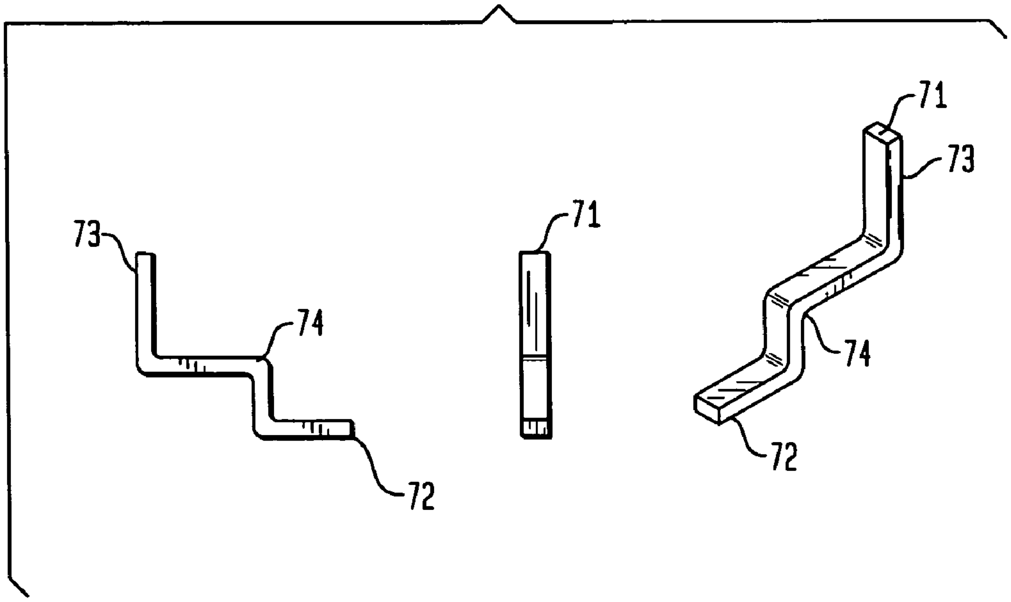
FIG. 7 presents three views of an advantageous connector pin.

The base header 18B advantageously comprises a plurality of metal connector pins 183 (better shown in FIG. 7). The pins are shaped and dimensioned to provide firm support and provide connection for numerous low current signals such as sensor signals. Advantageously each connector pin 183 comprises a short conductive metal rod 71 having a bent configuration defining a bottom contact surface 72 for contacting the board 11 and a lateral contact surface 73 perpendicular to surface 72 for contacting subassembly board 14. An intermediate bend 74 facilitates attachment to element 182B. The pins are attached to a longitudinal element 182B in co-planar relationship. The bottom surfaces 72 of the pins are advantageously co-planar on the xy plane. Here also the attachment is conveniently achieved by molding into a polymer element 182B. Alternatively the second base header 18B can include lugs 180 and be similar to header 18A.

Figure 3A:
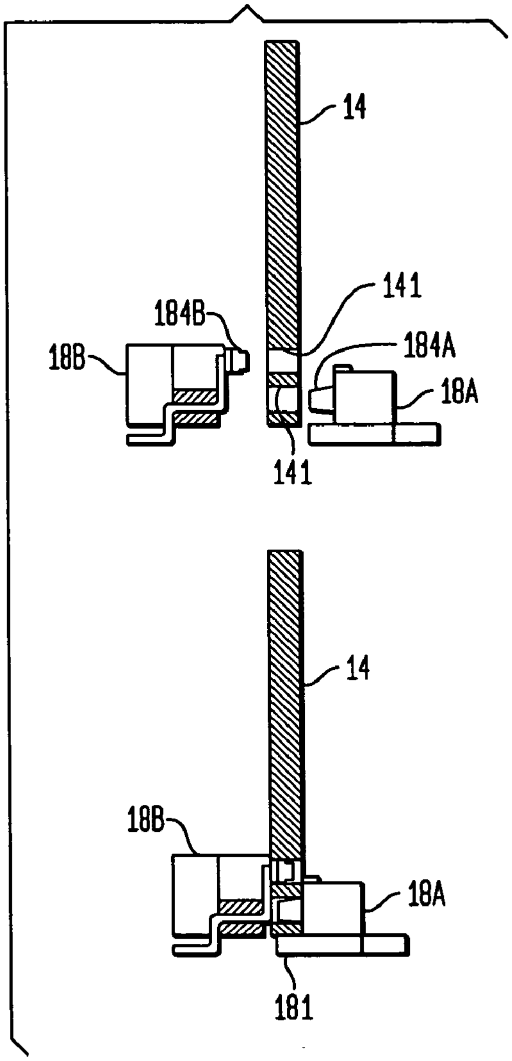
FIGS. 3A and 3B illustrate arrangements for registering and coupling the headers with the assembly board.

The base headers 18A and 18B are adapted for coupling onto boards 11 and 14. Advantageously the headers are manufactured with protruding regions 184A, 184B (pips) projecting toward the board 14 in registration with correspondingly dimensioned receiving apertures 141 in the board. The pips are inserted into the apertures 141 when the header is placed on the subassembly, and the pips act as locators for the headers in relation to the other header placed on the opposite side of the subassembly as illustrated in FIG. 3A, where the projecting pips 184A, 184B are vertically displaced (in the z direction).

Figure 3B:
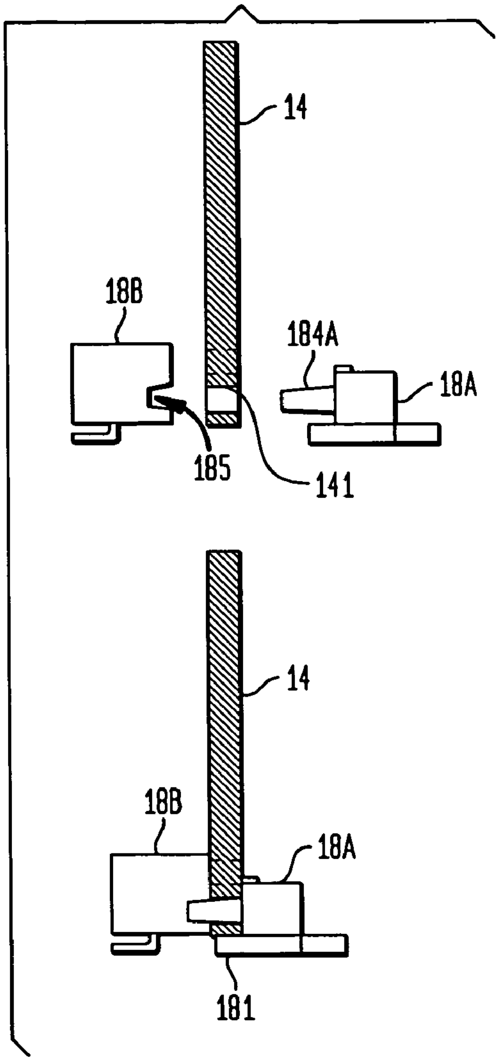

Alternatively, as illustrated in FIG. 3B, one header, e.g. 18A, could have a set of protruding pips 184A and the other header could have a set of receiving sockets 185 dimensioned and registered for receiving pips 184A. The male header 18A could then be placed onto the subassembly board 14 and reflowed. The female header could then be placed onto the subassembly with the socket section interlocking with the male section, ensuring co-planarity between the two headers.

Figure 4A:
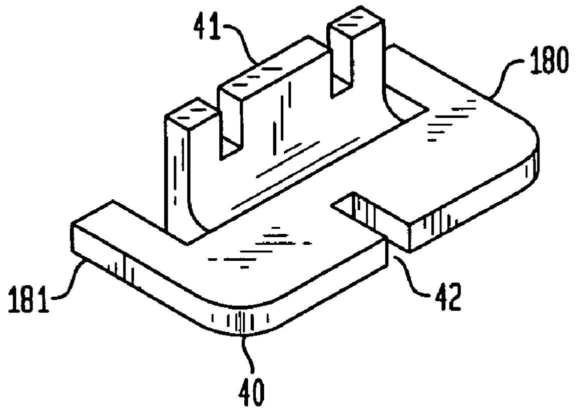
FIGS. 4A and 4B show advantageous support lugs.

FIG. 4A is an enlarged perspective view of an advantageous metal support lug 180 useful for vertically connecting the subassembly to the motherboard. The lug 180 is composed of a conductive body comprising a base section 40 and a transverse section 41. The lugs are shaped and dimensioned to provide firm support and high conductivity connection of high currents such as those provided by power converters.

The base section 40 can be a sheet of conductive material that is essentially planar in the xy-plane. The transverse section 41 is essentially planar in the yz plane perpendicular to the base section. The base section 40 advantageously has a width W in the y-direction greater than the extent w of the transverse section in the z-direction so that one or more arm portions 181 of the base section extend beyond the transverse section in the x-dimension. Thus the base section advantageously extends beyond the transverse section in front, behind (via arms 181) and on both sides, providing the transverse section with a firm foundation for mounting.

Advantageously, especially for high current applications, the base section 40 is partially split by one or more notches 42. This splitting has the advantage of relieving strain caused by differential thermal expansion or contraction between the lug and the motherboard.

Figure 4B:
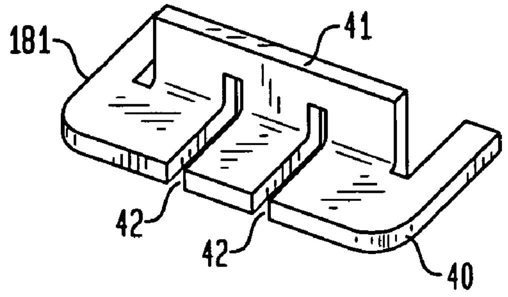

FIG. 4B illustrates an alternative configuration of lug 180 having multiple notches in the base 40.

The lugs 180 can be readily fabricated from a rectangular sheet of conductive material such as copper or copper alloy. A pair of cuts in the sheet separate the portion to become the transverse section 41 from the arms 181, and the transverse section can then be bent perpendicular to the sheet, leaving the remainder of the sheet as the base section 40. The resulting connector has arms 181 extending beyond the transverse section by a length that, in this instance, equals the height of the transverse section.

The connector is preferably provided with solderable surfaces for soldering onto system board mounting pads (not shown). Copper alloys such as phosphor bronze, beryllium copper or brass are advantageously plated with a thin layer of copper, nickel or gold, followed by solder, to enhance solderability.

The large form factors of the base and transverse sections provide paths with low inductance and low electrical and thermal resistance. Making the sections relatively thin with relatively large areas minimizes inductance and resistance.

Figure 5:
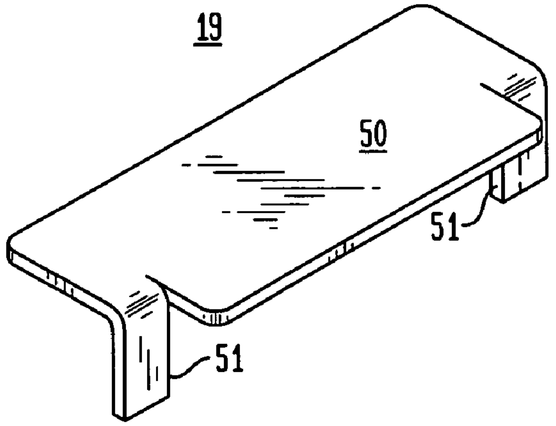
FIGS. 5 and 6 illustrate advantageous pick up caps.

FIG. 5 illustrates an optional pick-up cap useful in surface mounting the subassembly board. To ensure the assembly can be picked and placed by conventional equipment without the need for special grippers, a pick up cap 19 can be placed on the subassembly. The main surface area 50 of the cap 19 is horizontal to the subassembly when the cap is placed into position. The cap 19 provides a sufficient surface area to permit the board 14 subassembly to be picked up and placed by conventional vacuum nozzle means. Vertical arms 51 can be used to attach the cap 19 to board 14. The cap 19 can be formed from any metal or alloy such as copper or brass. It can be plated with a surface finish that is conducive with reflow soldering. The cap 19 can be formed in such a way that it can be picked from tape and reel or trays and placed onto the subassembly. The cap is then secured on the subassembly as by the reflow process.

Figure 6:
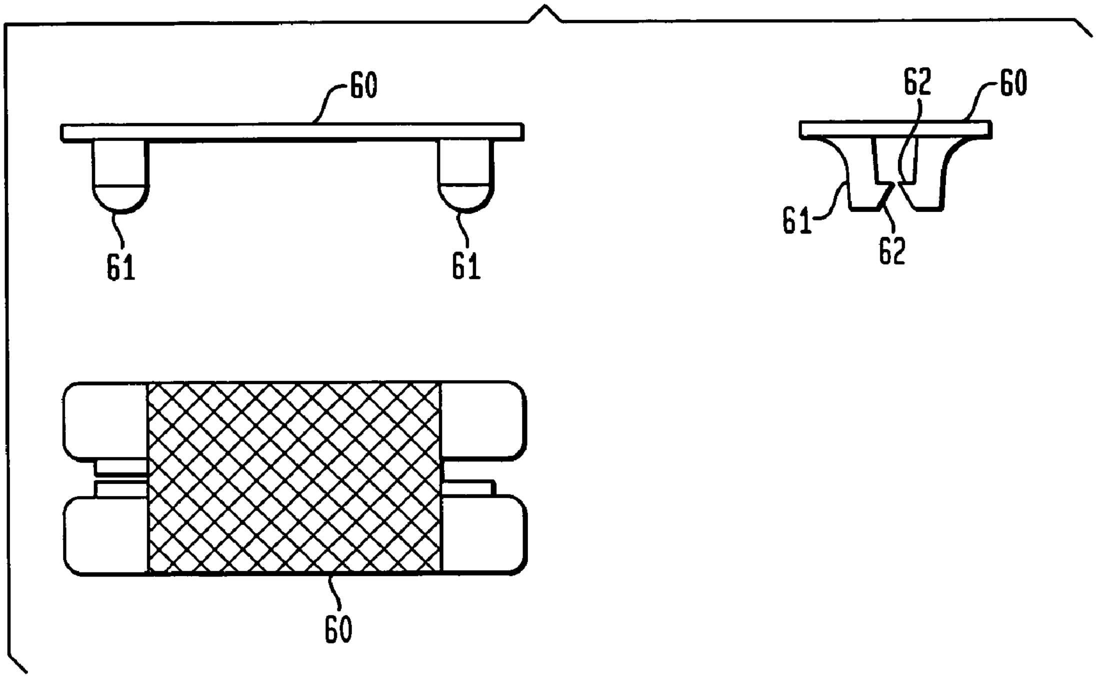

In an alternative embodiment shown in FIG. 6 the cap can be molded from a plastic compound. The compound should be of sufficiently high grade material to withstand the temperature extremes associated with reflowing surface mount devices. The cap 19 would have its main surface area 60 horizontal to the subassembly and provide sufficient surface area to pick and place the subassembly. The cap can also comprise a number of legs 61 that protrude perpendicular to the main pick up surface. The legs can be shaped at the ends so that they clip into a hole in the subassembly board 14. The legs are advantageously tapered at the ends to assist in the assembly of the cap and to avoid damage or stress during assembly. Each leg can have a lip 62 which acts as a grip when inserted into the hole in the assembly. The grip secures the cap in the place and prevents it from lifting off when the subassembly is being picked.

The combination of board, headers and optional cap are assembled into a subassembly which provides the means by which to pick and place the subassembly onto a system board with conventional pick and place equipment. The cap 19 provides the pick up point and the pins and lug headers or any combination of both provide a surface mountable, co-planar platform to place onto a system board. To further facilitate fabrication the vertical device can be placed on Tape and Reel equipment common in the electronics industry.

Figure 8B:
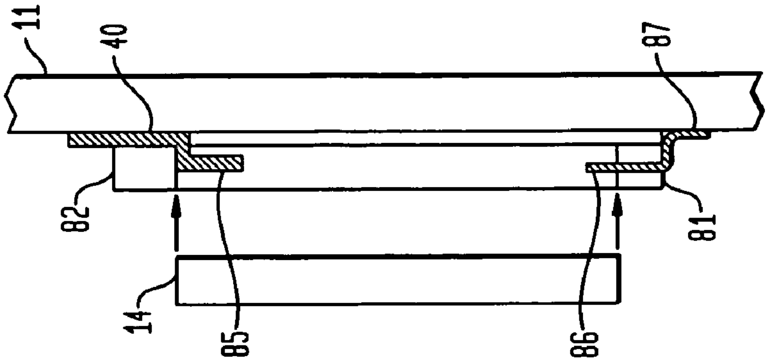
FIGS. 8A and 8B are top and cross sectional views showing a system board including an arrangement for horizontally mounting a subassembly on the surface of the system board.
Figure 8A:
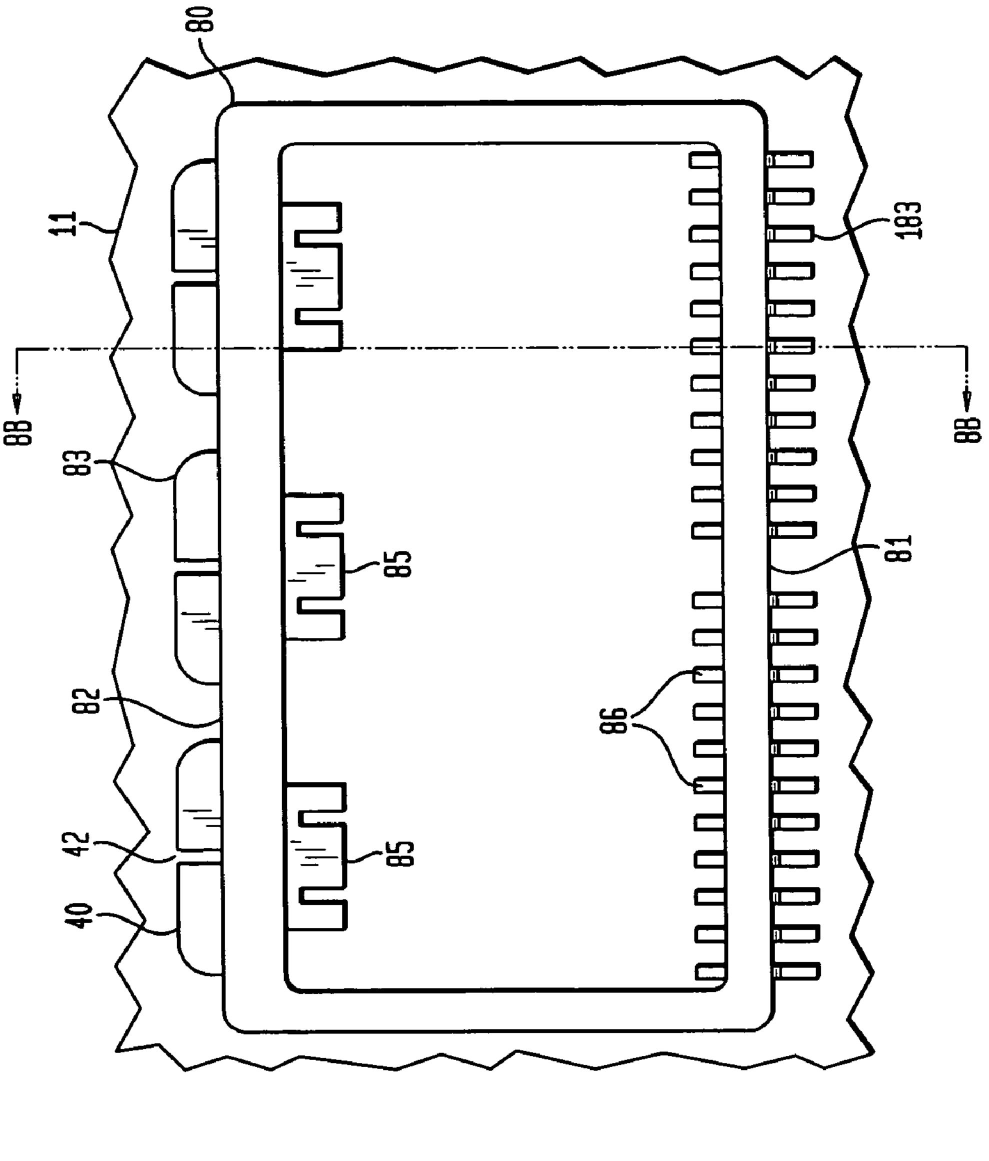

FIGS. 8A and 8B illustrate an alternative surface mounting arrangement wherein the subassembly board 14 (FIG. 8B) is mounted horizontally on the surface of the motherboard 11. In this arrangement, the power connector header and the sense connector pin header are conveniently opposing arms 81, 82 of a rectangular frame 80. One arm 81 of the frame comprises a plurality of connector pins 183 attached to the arm. Another arm 82, preferably the one opposing arm 81, is supported by or attached to a plurality of lugs 83 similar to lugs 180 but with an additional right angle bend 84 (FIG. 9) to provide a support surface 85 that will horizontally support board 14. The lug bases 40 each advantageously include one or more notches 42 to provide strain relief.

Conveniently the frame 80 comprises polymer, and the sense connector pins are integrally molded into the polymer with co-planar subassembly contact surfaces 86 and co-planar motherboard contact surfaces 87. The lugs 83 can be attached or molded to the frame 80 with co-planar motherboard contact bases 40 and support surfaces 85 that are preferably co-planar with the upper pin contact surfaces 86. The frame is sized so that the board 14 can drop into the interior of frame 80 onto contact surfaces 85 and 86.

Figure 9:
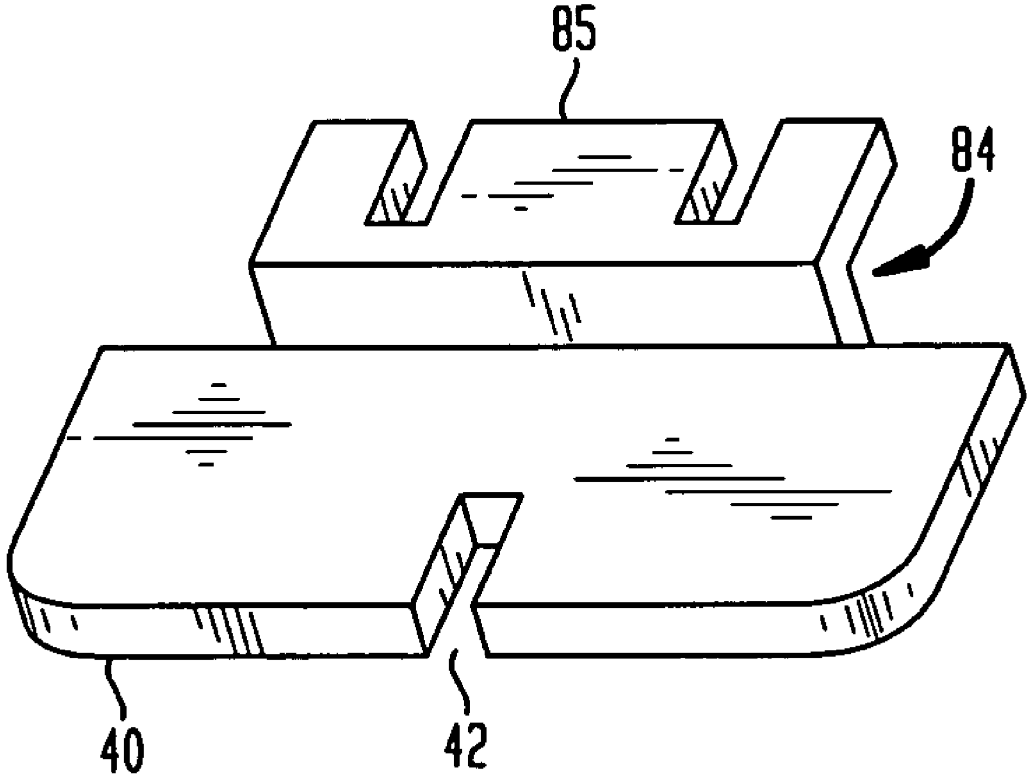
FIG. 9 is a perspective view of an advantageous mounting lug for use in the embodiment of FIG. 8.

FIG. 9 is a perspective view of an advantageous lug 83 for horizontal mounting showing the base 40, notch 42 and additional bend 84 to adapt the lug to horizontal mounting.

It can now be seen that, in one aspect, the invention comprises an arrangement to facilitate vertical mounting of a subassembly circuit board on a system circuit board (motherboard). The subassembly circuit board has a pair of major surfaces, a first edge to be mounted adjacent the system circuit board and an opposing second edge. A first base header to be mounted on the system circuit board comprises a plurality of mounting lugs attached to the header in co-planar configuration. A second base header to be mounted on the system circuit board comprises a plurality of connector pins attached to the header in co-planar configuration. The first and second headers are adapted to mechanically couple to the vertically mounted subassembly circuit board adjacent the first edge.

In a second aspect, the invention comprises an arrangement to facilitate horizontal mounting of a subassembly circuit board on a system circuit board. The arrangement comprises an open frame to be mounted on the system board, the frame having an open central region, an upper surface, a lower surface and first and second opposing arms. The first opposing arm comprises a plurality of mounting lugs attached to the arm in co-planar configuration, each lug supporting the lower surface of the frame and including a support surface extending into the open central region of the frame to support and contact the subassembly circuit board horizontally mounted in the central region. The second opposing arm comprises a plurality of connector pins attached to the arm in co-planar configuration. Each pin supports the lower surface of the frame and includes a contact surface extending into the open central region of the frame to support and contact the subassembly circuit board horizontally mounted in the central region.

The advantages of the inventive surface mounting arrangements, especially for mounting high current subassemblies, are manyfold. The include:

- The arrangement offers a high density low-profile power converter-to-board interconnection, either horizontal or vertical, with preferably three contacts for power and as many as twenty or more contacts for signal and sense.
- The surface mount interconnection product is more reliable and space efficient design over all other comparable interconnection technologies including through-hold pins and edge-card sockets for delivering high current.
- The design concepts improve the reliability of solder joints at interconnections subjected to high currents (>5 Amps) while also providing robust structural connection between the power converter and the motherboard (PCB).
- The stress relief provided for the power interconnects ensures robust structural connections between all mating interfaces by consistent and uniform solder wetting.
- Separation of signal and sense interconnects from power interconnects ensures relatively "clean" power delivery. Further, segmenting power from signal leads to less power supply noise in the overall system.
- The solid interface between the converter and the PCB ensures the most efficient transfer of thermal energy from the converter.
- The vertical configuration of the interconnect system makes a power converter with heatsinks on both sides feasible which results in more heat transferred to the forced-air stream and less on the customer motherboard.
- The thermal efficiency provided by the power interconnects are much superior to that provided by other interconnect methods by and overwhelming factor of 10 to 50.
- The configuration of multiple interconnects tied together by plastic tie bars and headers leads to significantly less pick-and-place operations and increased coplanarity.
- The male and female pip features provided in the headers enable each other to align automatically along with the Power SiP module, ensuring very good coplanarity.
- The interconnects meet the temperature profiles required for surface mount assembly.
- The design permits choices of materials for the interconnection system include Copper, Beryllium Copper, Brass, Phosphor Bronze with Gold-, Tin-, or Nickel-finish for the conductors, and a host of PPS or other plastics with heat deflection temperatures above 300C.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. An arrangement to facilitate vertical mounting of a subassembly circuit board on a system circuit board comprising:

a subassembly circuit board having a pair of major surfaces, a first edge to be mounted adjacent the system circuit board, and an opposing second edge;

a first base header to be mounted on the system circuit board comprising an elongated header and a plurality of mounting lugs attached to the header in co-planar configuration, wherein each lug of said plurality is a conductive body comprising a base section and a transverse section, the base section comprising a generally planar section for connecting to the major surface of the system board and the transverse section comprising a generally planar section substantially perpendicular to the base section for connecting to a major surface of the subassembly board;

a second base header to be mounted on the system circuit board comprising an elongated header and a plurality of connector pins attached to the header in co-planar configuration;

wherein the first and second base headers are adapted to mechanically couple to the vertically mounted subassembly circuit board adjacent the first edge.

2. The arrangement of claim 1 wherein the subassembly circuit board comprises a plurality of openings and the base headers each include one or more projecting portions in registration with openings in the subassembly circuit board for aligning the base headers in relation to the subassembly circuit board and each other.

3. The arrangement of claim 1 wherein the subassembly circuit board comprises a plurality of openings, at least one base header includes a plurality of projecting portions in registration with openings in the subassembly circuit board, and the other base header includes a plurality of sockets in registration with projecting portions, whereby projecting portions can be inserted through the openings into the sockets to align the headers and interlock the headers with the subassembly circuit board.

4. The arrangement of claim 1 wherein the base section has a width greater than the width of the transverse section and a length extending beyond the transverse section, so that the base section extends beyond the transverse section in front, behind and on both sides.

5. The arrangement of claim 1 wherein the mounting lugs are attached to the header by molding.

6. An arrangement to facilitate horizontal mounting of a subassembly circuit board on a system circuit board comprising:

an open frame to be mounted on the system circuit board, the frame having an open central region, an upper surface, a lower surface and first and second opposing arms;

the first opposing arm comprising a plurality of mounting lugs attached to the arm in co-planar configuration, each lug supporting the lower surface of the frame and including a support surface extending into the open central region of the frame to support and contact the subassembly circuit board horizontally mounted in the central region;

the second opposing arm comprising a plurality of connector pins attached to the arm in coplanar configuration, each pin supporting the lower surface of the frame and including a contact surface extending into the open central region of the frame to support and contact the subassembly circuit board horizontally mounted in the central region.

7. The arrangement of claim 6 wherein the frame is attached and connected to a system board by the lugs and the connector pins.

8. The arrangement of claim 7 wherein a subassembly circuit board is mounted in the open central region and connected to the systems board by the lugs and the connector pins.

9. The arrangement of claim 8 wherein the subassembly circuit board includes one or more power converters and each power converter is connected to the motherboard by one or more lugs.

10. The arrangement of claim 6 wherein the mounting lugs and connector pins are attached to the frame by molding.

* * * * *